United States Patent
Maurer

(10) Patent No.: US 9,019,045 B2
(45) Date of Patent: Apr. 28, 2015

(54) FILTER CIRCUIT HAVING IMPROVED FILTER CHARACTERISTIC

(75) Inventor: Gerhard Maurer, Germering (DE)

(73) Assignee: EPCOS AG, Munich (DE)

(*) Notice: Subject to any disclaimer, the term of this patent is extended or adjusted under 35 U.S.C. 154(b) by 598 days.

(21) Appl. No.: 13/383,354

(22) PCT Filed: Jul. 20, 2010

(86) PCT No.: PCT/EP2010/060493
§ 371 (c)(1),
(2), (4) Date: Mar. 27, 2012

(87) PCT Pub. No.: WO2011/009868
PCT Pub. Date: Jan. 27, 2011

(65) Prior Publication Data
US 2012/0194298 A1    Aug. 2, 2012

(30) Foreign Application Priority Data
Jul. 21, 2009 (DE) .................. 10 2009 034 101

(51) Int. Cl.
*H03H 9/54* (2006.01)
*H03H 9/64* (2006.01)
*H03H 9/05* (2006.01)
*H03H 9/56* (2006.01)
*H03H 9/60* (2006.01)
*H03H 9/70* (2006.01)
*H03H 9/72* (2006.01)

(52) U.S. Cl.
CPC .......... *H03H 9/0542* (2013.01); *H03H 9/6483* (2013.01); *H03H 9/568* (2013.01); *H03H 9/605* (2013.01); *H03H 9/6433* (2013.01); *H03H 9/706* (2013.01); *H03H 9/725* (2013.01)

(58) Field of Classification Search
CPC . H03H 9/0542; H03H 9/0547; H03H 9/0557; H03H 9/0561; H03H 9/0566; H03H 9/0571; H03H 9/0576; H03H 9/542; H03H 9/568; H03H 9/605; H03H 9/6423; H03H 9/6433; H03H 9/6483; H03H 9/6493; H03H 9/706; H03H 9/725; H03H 9/6489
USPC .......................................... 333/189–196, 133
See application file for complete search history.

(56) References Cited

U.S. PATENT DOCUMENTS

| 6,747,530 B1 | 6/2004 | Selmeier |
| 6,765,458 B2 | 7/2004 | Yamaguchi |
| 6,885,260 B2 | 4/2005 | Nishimura et al. |

(Continued)

FOREIGN PATENT DOCUMENTS

| DE | 102 48 477 A1 | 5/2003 |
| EP | 1 196 991 B1 | 4/2002 |

(Continued)

OTHER PUBLICATIONS

IEEE Xplore abstract for Wang et al. "A UMTS-900 Duplexer", Nov. 2-5, 2008, one page.*

(Continued)

*Primary Examiner* — Barbara Summons
(74) *Attorney, Agent, or Firm* — Slater & Matsil, L.L.P.

(57) ABSTRACT

A ladder-type-like filter circuit is specified with improved filter behavior. Inductive elements that interconnect parallel resonators with ground are electromagnetically coupled to one another.

17 Claims, 5 Drawing Sheets

(56) References Cited

U.S. PATENT DOCUMENTS

| | | | |
|---|---|---|---|
| 6,927,649 B2 * | 8/2005 | Metzger et al. | 333/133 |
| 7,116,187 B2 | 10/2006 | Inoue | |
| 7,183,878 B2 * | 2/2007 | Kushitani et al. | 333/133 |
| 7,479,847 B2 * | 1/2009 | Yamakawa et al. | 333/133 |
| 7,692,513 B2 * | 4/2010 | Yoshimoto | 333/32 |
| 7,795,728 B2 | 9/2010 | Przadka | |
| 2003/0011446 A1 * | 1/2003 | Bradley | 333/187 |
| 2003/0058066 A1 * | 3/2003 | Taniguchi et al. | 333/193 |
| 2003/0112098 A1 * | 6/2003 | Frank | 333/189 |
| 2005/0062559 A1 * | 3/2005 | Seo et al. | 333/193 |
| 2006/0103487 A1 * | 5/2006 | Huynh | 333/133 |
| 2006/0139125 A1 | 6/2006 | Shiga-ken et al. | |
| 2007/0222540 A1 | 9/2007 | Nishigaki et al. | |
| 2009/0284328 A1 * | 11/2009 | Wiesbauer et al. | 333/175 |
| 2010/0026414 A1 * | 2/2010 | Iwaki et al. | 333/100 |

FOREIGN PATENT DOCUMENTS

| | | | |
|---|---|---|---|
| EP | 1 755 217 A2 | | 2/2007 |
| JP | 57-174913 | * | 10/1982 |
| JP | 2003-179518 | | 6/2003 |
| JP | 2006333168 A | | 12/2006 |
| JP | 2007-259296 A | | 10/2007 |
| JP | 2009-130627 A | | 6/2009 |
| WO | WO 2004/001963 A1 | | 12/2003 |
| WO | 2005055423 A1 | | 6/2005 |
| WO | WO 2008/074285 | * | 6/2008 |

OTHER PUBLICATIONS

Wang, K., et al., "A UMTS-900 Duplexer," IEEE International Ultrasonics Symposium Proceedings, 2008, pp. 899-902, conference date Nov. 2-5, 2008.

* cited by examiner

FILTER CIRCUIT HAVING IMPROVED FILTER CHARACTERISTIC

This patent application is a national phase filing under section 371 of PCT/EP2010/060493, filed Jul. 20, 2010, which claims the priority of German patent application 10 2009 034 101.3, filed Jul. 21, 2009, each of which is incorporated herein by reference in its entirety.

TECHNICAL FIELD

The invention relates to RF filter circuits that can be interconnected in mobile communication devices, for example, and have an improved filter characteristic. In a particular embodiment, a filter circuit which can be used as part of a duplexer circuit is specified.

BACKGROUND

In mobile communication devices, RF filters are used in order that in a frequency-dependent fashion selectively desired signals which propagate in a signal line are allowed to pass as much as possible without being changed and in order that undesired signals are prevented from propagating in the signal path. In a duplexer, for example, RF filters serve to allow a transmission signal to pass from the transmission signal path to the antenna and a reception signal to pass from the antenna to the reception path. RF filters which are only transmissive for signals and are interconnected to form a duplexer enable a mobile communication device to transmit and receive RF signals simultaneously in the different frequency bands. For this purpose, in the duplexer, it is then respectively the case that a transmission filter is interconnected between a transmission signal path and an antenna and a reception filter is interconnected between an antenna and a reception path.

Major challenges for the filters in the duplexer are, firstly, to obtain an insertion loss of the desired signals that is as low as possible and, secondly, to suppress undesired signals to the greatest possible extent in the respective signal path, i.e., to obtain good stop band suppression. At the same time, the intention is to ensure good isolation between the transmission signal path and the reception signal path. In this case, one measure of the performance of a duplexer is the scattering matrix S. In this case, the absolute value of the matrix element $S_{12}$, $|S_{12}|$, indicates the frequency-dependent attenuation (insertion loss) of RF signals which are conducted from the transmission signal path to the antenna. The absolute value of the matrix element $S_{23}$, $|S_{23}|$, denotes the frequency-dependent attenuation (insertion loss) of RF signals which are conducted from the antenna into the reception path. The absolute value of the matrix element $S_{13}$, $|S_{13}|$, denotes the frequency-dependent attenuation (isolation) between transmission signal path and reception signal path. That is to say that $S_{13}$ indicates that frequency-dependent power which, generally undesirably, is coupled from the transmission signal path directly into the reception signal path. A high isolation, i.e., a high attenuation of these signals, is desirable.

The trend toward ever more extensive miniaturization of RF circuits and, in particular, of mobile communication devices presents the developers of these devices with the challenge of obtaining a sufficient ratio (selection) of low insertion loss in the passband and high attenuation in the stop band, despite reduction in the size of the components. At the same time, a sufficient isolation between a transmission path and a reception path in the duplexer is also intended to be made available.

U.S. Pat. No. 7,116,187 B2 discloses a ladder-type-like filter circuit for RF signals. Ladder-type filter circuits consist of cascaded basic elements. The individual basic elements each comprise a series resonator and a parallel resonator. In this case, series and parallel resonators of adjacent basic elements can be combined. In this case, the series resonators of all the basic elements are connected in series in a signal path, while the parallel resonators interconnect that section of the signal path which is associated with the corresponding series resonator of the basic element with ground. U.S. Pat. No. 7,116,187 proposes implementing the ground links of the parallel resonators via a jointly utilized inductive element. What is disadvantageous about such a circuit design is that an additional inductive element has to be provided and accommodated in structural space that already has barely sufficient dimensions anyway.

SUMMARY OF THE INVENTION

Therefore, in one aspect the present invention specifies an RF filter circuit that has high selection, i.e., good stop band suppression and a low insertion loss, and which comprises as few additional circuit elements as possible. In a further aspect, the present invention specifies a filter circuit that can be used in a duplexer circuit with improved selection and improved isolation.

An embodiment of the invention comprises a ladder-type-like filter circuit having a first basic element, a second basic element, a first inductive element and a second inductive element. The first basic element has a first series resonator, which is interconnected in a signal path, and also a first parallel resonator, which interconnects the signal path with ground. The second basic element has a second series resonator, which is interconnected in the signal path in series with the first series resonator, and also a second parallel resonator, which interconnects the signal path with ground. The first inductive element is interconnected between the first parallel resonator and ground. The second inductive element is interconnected between the second parallel resonator and ground. The first and the second inductive element are designed such that they can couple electromagnetically to one another.

By virtue of the fact that the first inductive element and the second inductive element couple electromagnetically to one another, the transmission characteristic of the filter circuit is improved. The frequencies of so-called poles, which represent particularly high stop band suppression as a result of the "extraction effects" of the parallel resonators as a result of conducting away the RF signal to ground, can be shifted by the coupling without additional elements having to be inserted into the circuit design.

The electromagnetic coupling between the first and the second inductive element can be achieved by means of a suitable arrangement of those conductive structures which represent the inductive elements. Although such an arrangement of the conductive structures which is suitable for a better transmission characteristic of the filter generally goes against endeavors for reducing the size of the corresponding components, the relinquishment of further circuit elements which is achieved by means of this arrangement can more than compensate for this increase in the space requirement. Thus, a circuit which will obtain an improved filter characteristic in conjunction with an only slightly increased space requirement is obtained overall.

The basic elements with the coupled inductances do not have to be directly adjacent in the filter circuit.

In one embodiment of the present invention, the filter circuit furthermore comprises at least one further basic element, the series resonator of which is likewise interconnected in the signal path, to be precise in series with the first series resonator and in series with the second series resonator. The parallel resonator of the at least one further basic element is interconnected with ground via an inductive element. Further series resonators of further basic elements can likewise be interconnected in series with the rest of the series resonators in the signal path. The further parallel resonators are then correspondingly interconnected between the signal path and ground.

By virtue of the fact that, in principle, as many basic elements as desired, e.g., 3, 4, 5, 6, 7 or more than 7, can be interconnected in series in the filter circuit, the stop band suppression and the isolation can be improved further. However, the use of many basic elements in the ladder-type circuit is opposed by the increased space requirement. What is advantageous about the use of a plurality of basic elements in this case is the presence of a respective pole in the stop frequency range per parallel resonator and also the increased number of possibilities for the combination of the electromagnetic coupling of the inductive elements interconnected between the respective parallel resonators and ground. It is thus possible, when using a filter circuit having three (or more) parallel paths with inductive elements, to electromagnetically couple two or even all three (or more) inductive elements. The coupling inductive elements can be the elements arranged on the input side or the elements arranged on the output side. Moreover, the inductive element on the input side can be coupled to the element on the output side. When using four or more basic elements in the ladder-type circuit, two interconnections of in each case two inductive elements can be provided.

In one configuration, the first inductive element and the second inductive elements comprise conductor sections which are arranged parallel to one another and coupled to one another. The degree of coupling of the conducting sections of the inductive elements is determined in this case, e.g., by the length of the conductor sections, by the distance between the conductor sections and by the phase relationship of the RF signals which propagate in the conductor sections, and also by material constants, and the materials surrounding the conductor sections. The conductor sections of the inductive elements can be embodied in rectilinear fashion, but they can also follow a curved track and, in particular, a trajectory shaped in any desired fashion. In particular, the conductor sections of the inductive elements can follow segments of a circle or of an oval or of a rectangle with curved corners.

In one configuration of the filter circuit, however, the conductor sections comprise rectilinearly shaped metallizations. From metallizations running rectilinearly at least in pieces, it is possible to configure virtually arbitrarily shaped polygons having, in principle, any desired length. Metallizations embodied in a meandering fashion enable, for example, long conductor sections in conjunction with a comparatively small space requirement.

In one configuration of the filter circuit, the first inductive element comprises a coil element having a number of turns $w1$ in the interval $0.5 <= W1 <= 2$ and the second inductive element comprises a coil element having a number of turns $W2$ in the interval $0.5 <= W2 <= 5$, wherein both coil elements are arranged parallel and at least partly overlap. In this case, odd numbers of turns can be realized by conductor sections which are not modeled on a full circle, but rather only on a corresponding circle arc segment. In this case, the windings of a coil element can be arranged in one plane. However, they can also be distributed among different planes of a, for example, ceramic, multilayer substrate. What is essential is that the magnetic flux generated by one of the two coil elements interacts with the respective other coil element. In this case, the strength of the electromagnetic coupling is substantially influenced by the spatial orientation of the coils, by the inductance of the coils and by the distance between the coils.

In one advantageous configuration of this embodiment, the number of turns W1 of the first inductive element is 0.75 and the inductance I1 of the first inductive element is $0.3\,nH <= I1 <= 0.9\,nH$. The number of turns $w2$ of the second inductive element is 2.5 and the inductance I2 of the second inductive element is $1.0\,nH <= I2 <= 2.0\,nH$.

In one configuration, the inductance of the first inductive element is $I1=0.6\,nH$ and that of the second inductive element is $I2=1.6\,nH$.

In one configuration, the inductance of the second inductive element I2 is three times the inductance of the first inductive element I1.

In one embodiment, the first inductive element and the second inductive element in each case comprise coupled conductor sections which are arranged as structured metallizations in a multilayer substrate. A multilayer substrate, which generally comprises a multiplicity of dielectric and, e.g., ceramic layers arranged one above another, between which are arranged metallization planes in which structured conductor sections are arranged, is very well suited to receiving impedance elements. Besides capacitive elements which can be structured as metalized areas lying one above another, a metallization plane can comprise conductor sections of an inductive element. Parts of the windings can be embodied in spiral fashion. The end points of the turns forming a coil can be contact-connected by plated-through holes (vias) from an overlying or underlying plane.

Inductive elements composed of coil elements arranged in a spiral fashion have the advantage that they find space in a single metallization plane; however, they simultaneously have the disadvantage that the size, i.e., the diameter or the circumference, of each individual coil turn is different. In contrast thereto, coil elements whose turns have the same cross-sectional area can also be accommodated in a multilayer substrate. These coil turns can then be arranged one above another in different metallization layers of the substrate. Each winding is interconnected at one end by a plated-through hole with an overlying winding and at the other end by a plated-through hole with an underlying turn.

In one embodiment, the multilayer substrate comprises dielectric layers which are selected from HTCC (High Temperature Cofired Ceramics), LTCC (Low Temperature Cofired Ceramics) and laminate. The structured metallizations which form the coil elements are arranged between the dielectric layers.

In one embodiment, at least one of the series or one of the parallel resonators is a resonator operating with surface acoustic waves or with bulk acoustic waves. It is possible for only one of the resonators to be a resonator operating with acoustic waves. It is likewise possible for all of the series and parallel resonators to operate with acoustic waves. It is advantageous if all the series and all the power resonators operate either with surface acoustic waves or with bulk acoustic waves.

In one embodiment, the filter circuit constitutes a reception filter in the reception path of a mobile communication device.

In general, the requirements made of reception filters are more stringent and thus more difficult to realize than those in transmission filters, since the reception filters are intended to protect electronic components interconnected in the reception path, for example, low noise amplifiers, against the high RF power of the RF signals propagating in the transmission path. In other words, particularly stringent isolation requirements between transmission signal path and reception signal path therefore concern the reception filter. Consequently, a filter circuit according to an embodiment of the invention, which exhibits improved isolation by the electromagnetic coupling of inductive elements and the influencing of poles thereby in a simple manner, constitutes a suitable filter circuit for interconnection as a reception filter in a mobile communication device.

The same argumentation also applies to a duplexer circuit. In one embodiment, the filter circuit is interconnected as a reception filter of a duplexer circuit in the reception path of a mobile communication device.

In a further embodiment, the filter circuit comprises four basic elements interconnected in series in the signal path. That inductive element via which a first of the two outer parallel resonators is interconnected with ground and that inductive element through which the other outer parallel resonator is interconnected with ground couple electromagnetically to one another. The term "outer" parallel resonators denotes the parallel resonators of those basic elements of a filter circuit which are interconnected directly with the output and respectively with the input of the filter circuit.

BRIEF DESCRIPTION OF THE DRAWINGS

The filter circuit is explained in greater detail below on the basis of exemplary embodiments and associated schematic figures, in which.

DETAILED DESCRIPTION OF ILLUSTRATIVE EMBODIMENTS

Figure 1:
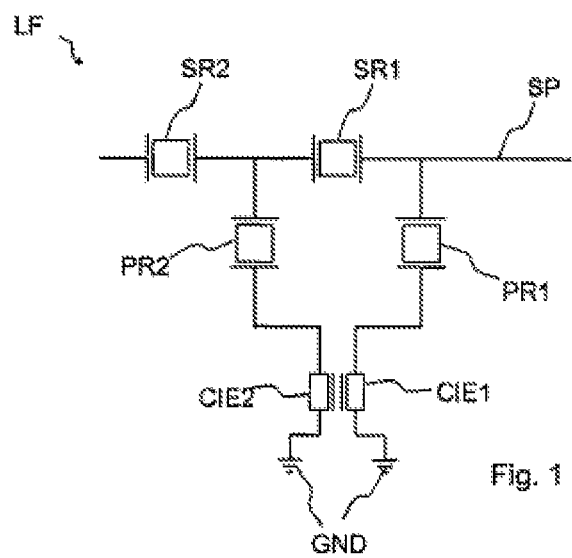
FIG. 1 shows a basic form of the filter circuit.

FIG. 1 schematically illustrates a filter circuit comprising electromagnetically coupling inductive elements. The ladder-type-like filter circuit LF comprises a signal path SP, in which a first series resonator SR1 and a second series resonator SR2 are interconnected in series. Together with the series resonator SR1, a parallel resonator PR1 forms the first basic element of the ladder-type-like filter circuit LF. The parallel resonator PR1 is interconnected with ground GND via an inductive element CIE1. The second series resonator SR2 and the second parallel resonator PR2 form the second basic element of the ladder-type-like filter circuit LF. The parallel resonator PR2 is likewise interconnected with ground GND via an inductive element CIE2. The inductive elements CIE1 and CIE2, which interconnect the first parallel resonator PR1 and the second parallel resonator PR2, respectively, with ground GND, couple electromagnetically to one another, symbolized by the two vertical lines between the elements.

Figure 2:
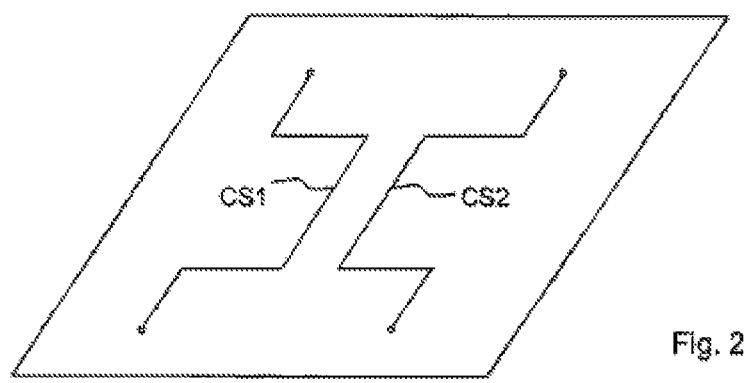
FIG. 2 shows the arrangement of two coupling conductor sections.

FIG. 2 illustrates two electromagnetically coupling conductor sections CS1 and CS2. The latter are arranged in one plane and run parallel in sections. The extent of the electromagnetic coupling is determined, inter alia, by the length of and distance between the parallel conductor sections.

Figure 3A:
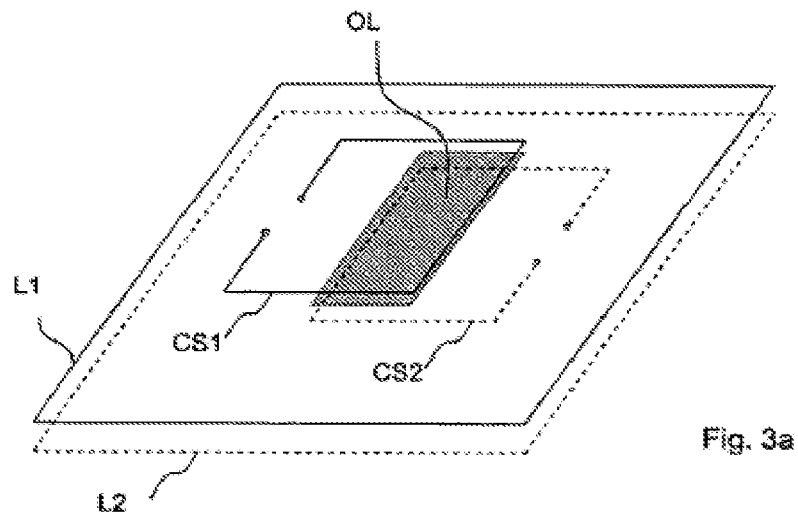
FIG. 3a shows one possible arrangement of coupling turns.

FIG. 3a illustrates the spatial arrangement of two electromagnetically coupling conductor sections CS1 and CS2 in a further embodiment. The coupling conductor sections of both inductive elements substantially consist of rectilinearly led conductor sections. The number of turns of the segments are somewhat less than one. Both conducting sections thus constitute coil-like coupling elements and are in each case arranged in different planes L1, L2 arranged parallel to one another. The hatched area OL illustrates the overlap area of the cross-sectional areas of coupling turns which, together with the distance between the turn elements, is crucial for the electromagnetic coupling. The respective conductor sections CS1 and CS2 can form, independently of one another, even further turns, arranged in other planes, of coils which can contribute to the coupling.

Figure 3B:
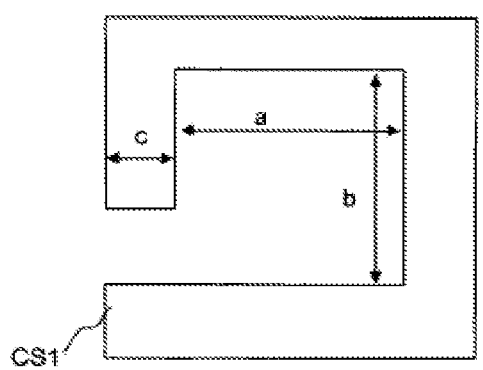
FIG. 3b shows a coil element having an odd number of turns.

FIG. 3b illustrates an inductive element having a number of turns of approximately 0.75, which element consists of a structured metallization. The width c of the metallization is approximately between 50 and 200 µm, preferably 100 µm. In the present case, the aspect ratio, i.e., the ratio of width to length a/c, of the ¾ winding is substantially one. Both a and b are between 300 and 400 µm, and, preferably, both are approximately 350 µm.

Figure 4:
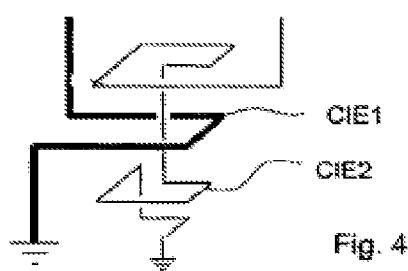
FIG. 4 shows a perspective view of coupling inductive elements.

FIG. 4 illustrates one possible course of metallic structures forming inductive elements CIE1, CIE2. Horizontally oriented structures can be embodied, for example, as metallizations in a multilayer substrate. Vertically oriented structures can comprise plated-through holes through one or a plurality of planes. The inductive element CIE1 substantially has a number of turns of 0.75, while the second inductive element CIE2 has a number of turns of approximately two. In this case, one of the turns is arranged above the three-quarter turn of the first inductive element CIE1. In this case, the other turn is arranged below the turn of the first inductive element.

Figure 5:
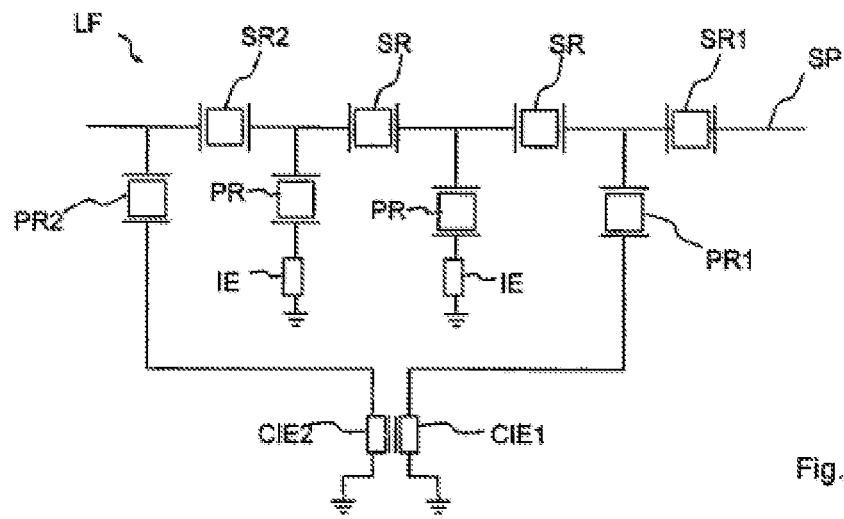
FIG. 5 shows an embodiment of the filter circuit having a plurality of basic elements.

FIG. 5 illustrates a configuration of the ladder-type-like filter circuit LF in which four basic elements of a ladder-type circuit are interconnected in series. Between the first series resonator SR1 and the second series resonator SR2, two further series resonators SR are interconnected in the signal path SP. Parallel resonators PR associated with the further series resonators interconnect the corresponding section of the signal path SP with ground via inductive elements IE. The first inductive element CIE1, which interconnects the first parallel resonator PR1 with ground, and the second inductive element CIE2, which interconnects the second parallel resonator PR2 with ground, couple electromagnetically to one another. First and second parallel resonators are in each case an outer parallel resonator.

Figure 6:
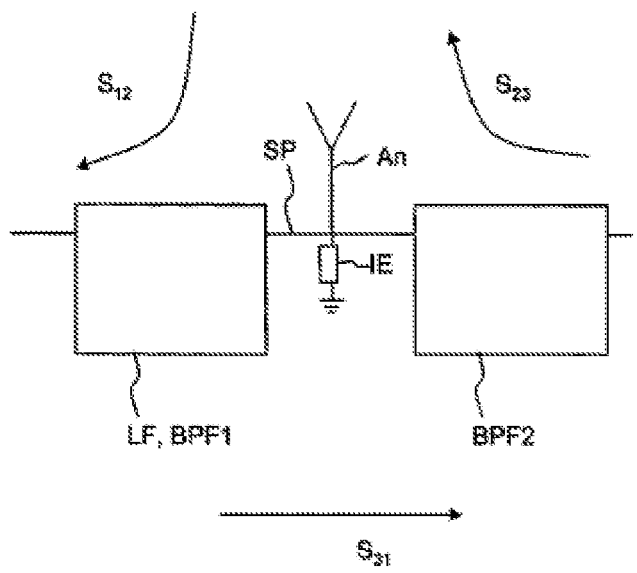
FIG. 6 shows a schematic interconnection of the ladder-type filter circuit in a duplexer circuit.

FIG. 6 illustrates one possible interconnection of the latter-type-like filter circuit LF as a bandpass filter BPF1 in a mobile communication device. The ladder-type-like filter circuit LF is interconnected in a signal path SP. The signal path SP is furthermore interconnected with an antenna An and an inductive element IE, which interconnects the antenna with ground. Furthermore, the signal path SP is interconnected with a further bandpass filter BPF2, which can be a transmission signal filter, for example. The first bandpass filter BPF1 is then preferably the reception filter interconnected in the reception signal path. In this case, the matrix element $|S_{12}|$ indicates the frequency-dependent transmission of reception signals from the antenna into the reception path Rx, while the matrix element $|S_{23}|$ indicates the frequency-dependent transmission for RF signals from the transmission path Tx to the antenna. In this case, the matrix element $|S_{13}|$ represents the isolation between reception signal path and transmission signal path.

Figure 7:
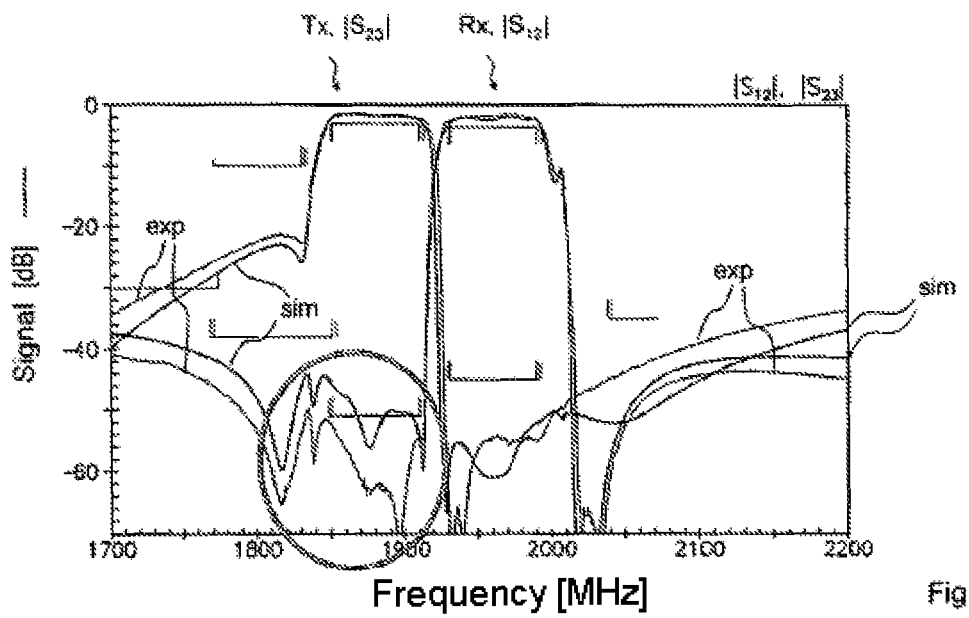
FIG. 7 shows the frequency profile of the matrix elements $|S_{12}|$ and $|S_{13}|$, of a calculation and of a measurement.

FIG. 7 illustrates the frequency-dependent profile of the matrix elements $|S_{12}|$ and $|S_{23}|$ of a duplexer circuit according to the invention both for calculations (identified by "sim") and in the form of experimentally measured curves (identified by "exp"). The matrix elements are shown in a frequency range around the transmission frequency range Tx and in the reception frequency range Rx. The oval denotes that frequency range in the transmission frequency range which needs particular attention since transmission signals having full transmission power are present at the reception filter input and are not permitted to pass through the reception filter.

Figure 8:
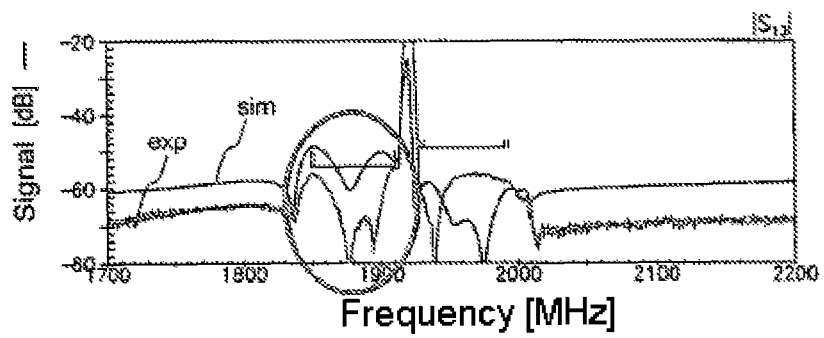
FIG. 8 shows the frequency-dependent profile of the matrix element $|S_{13}|$ (calculated and measured)

FIG. 8 illustrates the calculated ("sim") and measured ("exp") profile of the isolation curve $|S_{13}|$. In the critical (transmission) frequency range it can be seen that the measured curve, which indicates an exemplary embodiment with electromagnetically coupling inductive elements, is significantly improved relative to the calculated comparison curve, in which the coupling of the inductive elements is not taken into account. In particular, the attenuation of the pole is improved from −60 dB to −80 dB.

Figure 9:
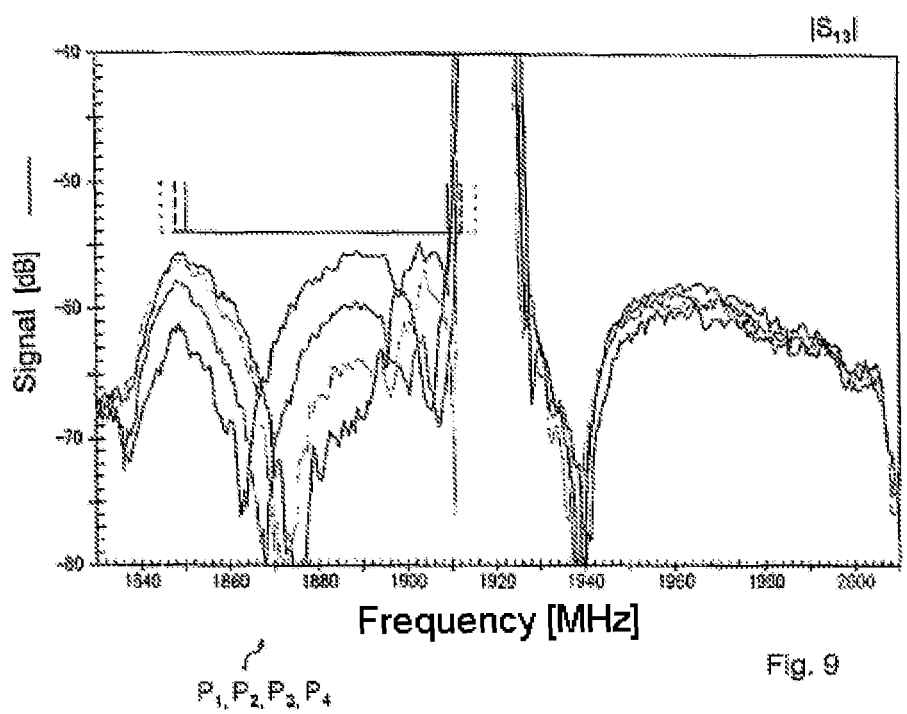
FIG. 9 shows different isolation curves of different configurations of the coupling inductive elements.

FIG. 9 illustrates the dependence of the frequency and the attenuation of poles $P_1$, $P_2$, $P_3$, $P_4$ in the profile of the isolation curve of a duplex with a filter circuit according to the invention. Various curves are shown, attributable to various geometrical configurations of the coupling inductances. It is clearly evident therefrom that parasitic couplings that occur anyway between inductive elements are not suitable for improving the isolation. Therefore, non-trivial configurations are needed in order to actually improve the isolation.

A filter circuit is not restricted to one of the exemplary embodiments described. Variations which encompass, for example, even further resonators, reactance elements or any desired combinations thereof in the signal path or in described or additional parallel paths likewise constitute exemplary embodiments according to the invention.

LIST OF REFERENCE SYMBOLS

LF: Ladder-type-like filter circuit
SR1: First series resonator
SR2: Second series resonator
SP: Signal path
PR1: First parallel resonator
PR2: Second parallel resonator
CIE1: First inductive element
CIE2: Second inductive element
GND: Ground
CS1, CD2: First, second coupled conductor section
A, B, C Length, width of an inductive element, thickness of the conductor section
IE: Inductive element
AN: Antenna
BPF1: First bandpass filter
BPF2: Second bandpass filter
$S_{12}$, $S_{23}$, $S_{31}$: Matrix elements of the scattering matrix S
TX: Transmission frequency range
RX: Reception frequency range
EXP: Measured profile of an S-matrix element
SIM: Calculated profile of an S-matrix element
P1, 2, 3, 4: Pole of a first, second, third, fourth configuration of coupled inductive elements
L1, L2: Planes in which inductive elements are arranged
OL: Overlap area of two inductive elements

The invention claimed is:

1. A filter circuit, comprising:
  a signal path;
  a first basic element arranged in the signal path, the first basic element having a first series resonator and a first parallel resonator that interconnects the signal path with ground;
  a second basic element having a second series resonator interconnected in the signal path in series with the first series resonator, the second basic element also having a second parallel resonator that interconnects the signal path with ground;
  a first inductive element comprising only a single coil element and being interconnected between the first parallel resonator and ground; and
  a second inductive element comprising only a single coil element and being interconnected between the second parallel resonator and ground, wherein the coil elements of the first and the second inductive elements vertically overlap at least partially and couple electromagnetically to one another.

2. The filter circuit according to claim 1, further comprising a further basic element having a series resonator interconnected in the signal path in series with the first series resonator and in series with the second series resonator, the further basic element also having a parallel resonator interconnected with ground via a third inductive element.

3. The filter circuit according to claim 2, further comprising a second further basic element having a series resonator interconnected in the signal path in series with the first series resonator and in series with the second series resonator, the second further basic element also having a parallel resonator interconnected with ground via an inductive element.

4. The filter circuit according to claim 1, wherein conductor sections of the first inductive element and conductor sections of the second inductive element are arranged parallel to one another and are coupled to one another.

5. The filter circuit according to claim 4, wherein the conductor sections comprise rectilinearly shaped metallizations.

6. The filter circuit according to claim 1, wherein the coil element of the first inductive element has a number of turns W1, where $0.5<=W1<=2$, and the coil element of the second inductive element has a number of turns W2, where $0.5<=W2<=5$, and wherein both coil elements are arranged in parallel.

7. The filter circuit according to claim 6, wherein the coil element of the first inductive element has the number of turns W1=0.75 and an inductance I1, where $0.3$ nH$<=I1<=0.9$ nH, and the coil element of the second inductive element has the number of turns W2=2.5 and an inductance I2, where $1.0$ nH$<=I2<=2.0$ nH.

8. The filter circuit according to claim 1, wherein the first inductive element and the second inductive element comprise respectively coupled conductor sections, and wherein the conductor sections are arranged as structured metallizations in a multilayer substrate.

9. The filter circuit according to claim 8, wherein the multilayer substrate comprises dielectric layers that are selected from HTCC, LTCC and laminate, and which are arranged between the structured metallizations.

10. The filter circuit according to claim 1, wherein the series or parallel resonators are resonators that operate with surface acoustic waves or resonators that operate with bulk acoustic waves.

11. The filter circuit according to claim 1, wherein the filter circuit is interconnected as a reception filter in a reception path of a mobile communication device.

12. The filter circuit according to claim 1, wherein the filter circuit is interconnected as a reception filter of a duplexer circuit in a reception path of a mobile communication device.

13. A filter circuit, comprising:
a signal path,
a first basic element arranged in the signal path, the first basic element having a first series resonator and a first parallel resonator;
a second basic element having a second series resonator coupled in the signal path in series with the first series resonator, the second basic element also having a second parallel resonator;
a first inductive element having only one coil element and being coupled between the first parallel resonator and ground;
a second inductive element having only one coil element and being coupled between the second parallel resonator and ground, wherein the first and the second inductive elements vertically overlap at least partially and are coupled electromagnetically to one another by an interaction of magnetic flux generated by one of the coil elements during operation;
a third basic element having a third series resonator coupled in the signal path in series with the first and second series resonators, the third basic element also having a third parallel resonator;
a third inductive element that is coupled between the third parallel resonator and ground;
a fourth basic element having a fourth series resonator coupled in the signal path in series with the first, second and third series resonators, the fourth basic element also having a fourth parallel resonator; and
a fourth inductive element that is coupled between the fourth parallel resonator and ground.

14. The filter circuit according to claim 13, wherein the third series resonator is located between the first and second series resonators and wherein the fourth series resonator is also located between the first and second series resonators.

15. The filter circuit according to claim 13, wherein each of resonators comprises a resonator that operates with surface acoustic waves.

16. The filter circuit according to claim 13, wherein each of resonators comprises a resonator that operates with bulk acoustic waves.

17. A filter circuit, comprising:
a signal path;
a first basic element arranged in the signal path, the first basic element having a first series resonator and a first parallel resonator that interconnects the signal path with ground;
a second basic element having a second series resonator interconnected in the signal path in series with the first series resonator, the second basic element also having a second parallel resonator that interconnects the signal path with ground;
a first inductive element interconnected between the first parallel resonator and ground; and
a second inductive element interconnected between the second parallel resonator and ground, wherein the first and the second inductive element are electromagnetically coupled to one another;
wherein the first inductive element comprises a coil element having a number of turns W1, where $0.5 \leq W1 \leq 2$, and the second inductive element comprises a coil element having a number of turns W2, where $0.5 \leq W2 \leq 5$, and wherein both coil elements are arranged parallel and at least partly overlap; and
wherein the first inductive element has the number of turns W1=0.75 and an inductance I1, where $0.3 \text{ nH} \leq I1 \leq 0.9 \text{ nH}$, and the second inductive element has the number of turns W2=2.5 and an inductance I2, where $1.0 \text{ nH} \leq I2 \leq 2.0 \text{ nH}$.

* * * * *